US009224583B2

(12) United States Patent
Povolny et al.

(10) Patent No.: US 9,224,583 B2
(45) Date of Patent: Dec. 29, 2015

(54) SYSTEM AND METHOD FOR HEATING PLASMA EXPOSED SURFACES

(71) Applicant: Lam Research Corporation, Fremont, CA (US)

(72) Inventors: Henry Povolny, Newark, CA (US); Rajinder Dhindsa, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 22 days.

(21) Appl. No.: 13/853,915

(22) Filed: Mar. 29, 2013

(65) Prior Publication Data
US 2014/0263177 A1   Sep. 18, 2014

Related U.S. Application Data

(60) Provisional application No. 61/801,697, filed on Mar. 15, 2013.

(51) Int. Cl.
C23C 16/50     (2006.01)
C23C 16/00     (2006.01)
C23F 1/00      (2006.01)
H01L 21/306    (2006.01)
H01J 37/32     (2006.01)
C23C 16/46     (2006.01)
C23C 16/458    (2006.01)

(52) U.S. Cl.
CPC ....... H01J 37/32715 (2013.01); C23C 16/4586 (2013.01); C23C 16/46 (2013.01); H01J 37/32733 (2013.01); H01J 37/32935 (2013.01)

(58) Field of Classification Search
CPC .................................................. C23C 16/4586
USPC ................. 118/728–732; 156/345.51–345.55
See application file for complete search history.

(56) References Cited

U.S. PATENT DOCUMENTS

| 5,968,038    | A  | * | 10/1999 | Djeu       | 606/16  |
| 6,018,616    | A  | * | 1/2000  | Schaper    | 392/418 |
| 2009/0026170 | A1 | * | 1/2009  | Tanaka et al. | 216/60  |
| 2009/0165713 | A1 | * | 7/2009  | Kim et al. | 118/719 |

* cited by examiner

Primary Examiner — Maureen Passey
Assistant Examiner — Tiffany Nuckols
(74) Attorney, Agent, or Firm — Martine Penilla Group, LLP

(57) ABSTRACT

A substrate support apparatus for a plasma processing system includes a layer of dielectric material having a top surface and a bottom surface. The top surface is defined to support a substrate in exposure to a plasma. The substrate support apparatus also includes a number of optical fibers each having a first end and a second end. The first end of each optical fiber is defined to receive photons from a photon source. The second end of each optical fiber is oriented to project photons received from the photon source onto the bottom surface of the layer of dielectric material.

18 Claims, 12 Drawing Sheets

SYSTEM AND METHOD FOR HEATING PLASMA EXPOSED SURFACES

CLAIM OF PRIORITY

This application claims priority under 35 U.S.C. 119(e) to U.S. Provisional Patent Application No. 61/801,697, filed Mar. 15, 2013, entitled "System and Method for Heating Plasma Exposed Surfaces," the disclosure of which is incorporated herein by reference in its entirety.

BACKGROUND OF THE INVENTION

In the fabrication of semiconductor devices such as integrated circuits, memory cells, and the like, a series of manufacturing operations are performed to define features on substrates, such as semiconductor wafers. Some manufacturing operations, such as etching and deposition, include plasma processing operations that are performed in a plasma processing chamber in which a process gas is transformed into a plasma comprising reactive constituents that can perform work on the substrate when exposed thereto. During such plasma processing operations, the substrate is held on an electrostatic chuck in exposure to the plasma. The electrostatic chuck is defined to establish an electrostatic field that attracts the substrate to a supporting surface of the electrostatic chuck, thereby securing the substrate to the electrostatic chuck.

In some systems the electrostatic chuck needs to be heated to achieve desired plasma processing results on the substrate. Electric heaters are often used to provide heating of the electrostatic chuck. However, wiring and heating elements associated with such electric heaters can interfere with transmission of radiofrequency power through the electrostatic chuck to the plasma processing volume. Such interference with transmission of the radiofrequency power can cause non-uniformities in the radiofrequency power distribution across the plasma processing chamber, thereby causing non-uniformities in the plasma density generated within the plasma processing volume. It is within this context that the present invention arises.

SUMMARY OF THE INVENTION

In one embodiment, a substrate support apparatus for a plasma processing system is disclosed. The substrate support apparatus includes a layer of dielectric material having a top surface and a bottom surface. The top surface of the layer of dielectric material is defined to support a substrate in exposure to a plasma. The substrate support apparatus also includes a number of optical fibers each having a first end and a second end. The first end of each optical fiber is defined to receive photons from a photon source. The second end of each optical fiber is oriented to project photons received from the photon source onto the bottom surface of the layer of dielectric material.

In one embodiment, a plasma processing system is disclosed. The system includes a substrate support including a layer of dielectric material having a top surface and a bottom surface. The top surface is defined to support a substrate in exposure to a plasma generation region. The substrate support includes a baseplate of thermally conductive material. The layer of dielectric material is affixed to a top surface of the baseplate. The baseplate includes a number of passages having respective exit locations at the top surface of the baseplate. The system also includes a number of optical fibers respectively routed through the number of passages within the baseplate. Each of the number of optical fibers has a first end and a second end. The first end of each optical fiber is defined to receive photons. The second end of each optical fiber is oriented to project photons onto the bottom surface of the layer of dielectric material. The system also includes a photon source connected to transmit photons into the first end of each of the number of optical fibers.

In one embodiment, a method is disclosed for operating a plasma processing system. The method includes disposing a substrate on a top surface of a layer of dielectric material. The method also includes transmitting photons into a number of optical fibers. The number of optical fibers are routed to project photons onto a bottom surface of the layer of dielectric material so as to heat the layer of dielectric material. The method also includes controlling an amount of photons transmitted into the number of optical fibers so as to control a heating of the layer of dielectric material.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
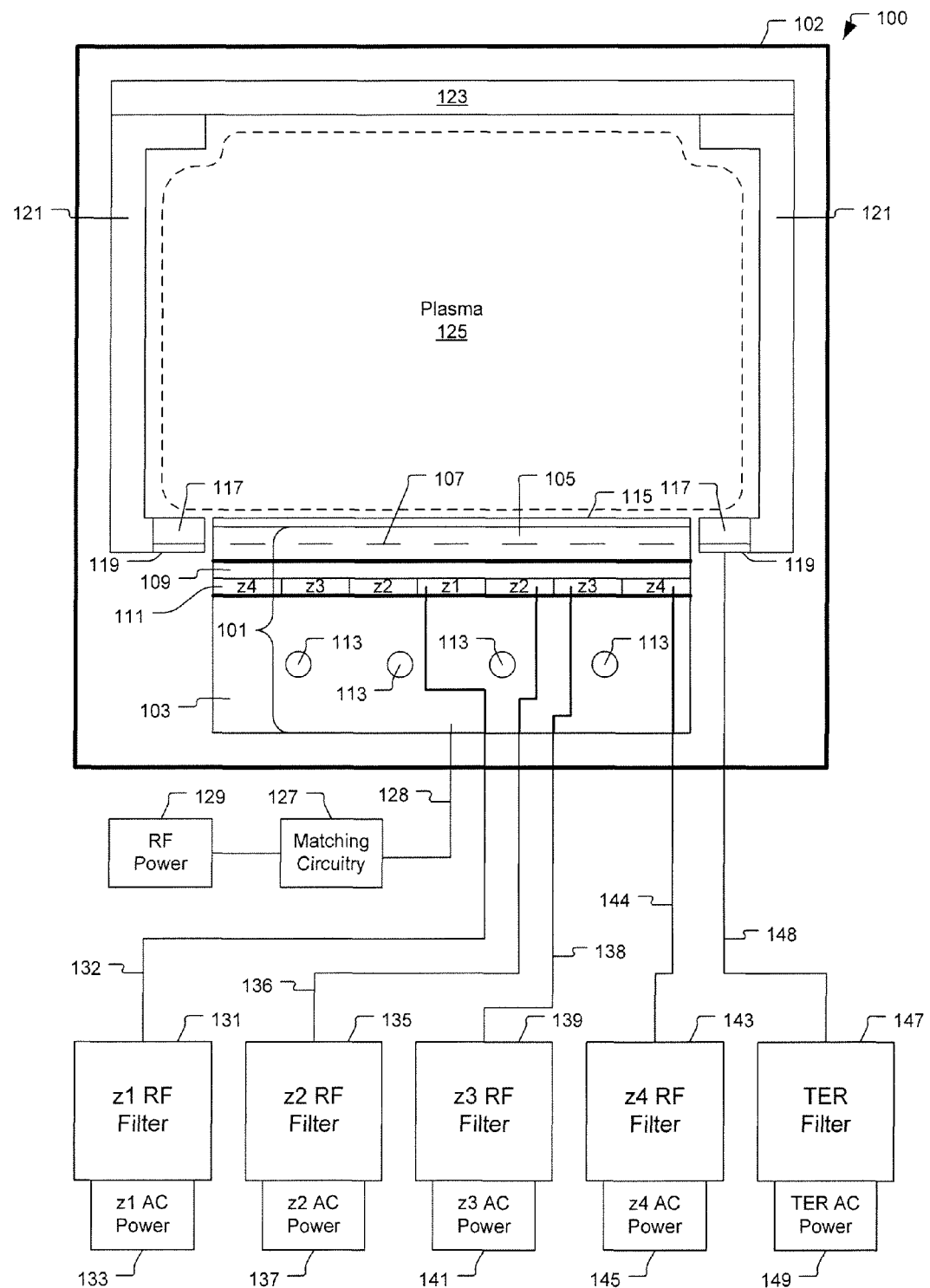
FIG. 1A shows a vertical cross-section of a plasma-driven substrate processing system, in accordance with one embodiment of the present invention.

FIG. 1A shows a vertical cross-section of a plasma-driven substrate processing system 100, in accordance with one embodiment of the present invention. The system 100 includes a chamber 102. The chamber 102 encloses a substrate processing region within which a plasma 125 is generated, and in which a substrate 115 is held in a secured manner on an electrostatic chuck 101 in exposure to the plasma 125, whereby the top surface of the substrate 115 is exposed to reactive constituents of a plasma 125. In one embodiment, the chamber 102 includes a top electrode 123 and a side shroud 121. Also, in one embodiment, the chamber 102 includes an edge ring 117 disposed to circumscribe the electrostatic chuck 101 at a top surface of the electrostatic chuck 101 upon which the substrate 115 is secured.

In one embodiment, the term "substrate" as used herein refers to a semiconductor wafer. However, it should be understood that in other embodiments, the term "substrate" as used herein can refer to substrates formed of sapphire, GaN, GaAs or SiC, or other substrate materials, and can include glass panels/substrates, metal foils, metal sheets, polymer materials, or the like. Also, in various embodiments, the "substrate" as referred to herein may vary in form, shape, and/or size. For example, in some embodiments, the "substrate" as referred to herein may correspond to a 200 mm (millimeters) semiconductor wafer, a 300 mm semiconductor wafer, or a 450 mm semiconductor wafer. Also, in some embodiments, the "substrate" as referred to herein may correspond to a non-circular substrate, such as a rectangular substrate for a flat panel display, or the like, among other shapes. The "substrate" referred to herein is denoted in the various example embodiment figures as substrate 115.

In various embodiments, the chamber sidewalls, top structure, bottom structure, etc., can be formed from different materials, such as stainless steel or aluminum, by way of example, so long as the chamber materials are structurally capable of withstanding pressure differentials and temperatures to which they will be exposed during plasma processing, and are chemically compatible with the plasma processing environment. Also, in one embodiment, the chamber sidewalls, top structure, bottom structure, etc., are formed of an electrically conductive material, and are electrically connected to an electrical ground potential.

The substrate processing region, within which the plasma 125 is generated, is in fluid communication with a process gas source. During operation, one or more process gases are flowed from the process gas source to the substrate processing region. In one embodiment, upon entering the substrate processing region, the process gases flow through the substrate processing region to peripheral vents, and are pumped out through exhaust ports by an exhaust pump. The system 100 also includes a radiofrequency (RF) power supply 129 defined to supply RF power through matching circuitry 127 to a baseplate 103 of the electrostatic chuck 101, as indicated by the electrical connection 128.

The matching circuitry 127 is defined to ensure efficient RF power transmission to the baseplate 103 of the electrostatic chuck 101. In one embodiment, the RF power supply 129 is defined to supply RF power having a frequency of about 13.56 MHz. In other embodiments, the RF power supply 129 is defined to supply RF power having a frequency of about 2 MHz, or about 4 MHz, or about 13.56 MHz, or within a range extending from about 200 kHz to about 400 kHz, or a combination thereof, among others. It should be understood, however, that the RF power supply 129 can be defined to supply RF power at any frequency/frequencies required for a particular plasma processing operation. The RF power transmitted from the RF power supply 129 causes the process gases within the substrate processing region to transform into reactive constituents of the plasma 125, including radical constituents and charged specie constituents, e.g., ions. The reactive constituents of the plasma 125 affect processing of the substrate 115. For example, in one embodiment, the reactive constituents of the plasma 125 perform an etching process on the substrate 115.

In the example embodiment of FIG. 1A, the system 100 is defined as a capacitively coupled chamber, in which the substrate processing region is exposed to a pair of spaced apart electrodes 101 and 123, with the electrostatic chuck 101 serving as a powered electrode and the top electrode 123 electrically connected to a reference ground potential. The electrostatic chuck 101 is electrically connected to one or more power supplies, such that power (either direct current (DC), RF, or a combination thereof) is transmitted between the pair of electrodes 101 and 123 and through the substrate processing region, so as to transform the process gas delivered from the process gas source into the plasma 125.

It should be understood that the capacitively coupled power delivery system of FIG. 1A is shown by way of example. In other embodiments, the system 100 can be defined to generate the plasma 125 in different ways. For example, in one embodiment, the system 100 is defined as inductively coupled chamber, in which RF power is transmitted into the plasma 125 generation region from a powered coil. In yet another embodiment, the system 100 is defined as a microwave-driven chamber in which a microwave power source is used to transform the process gas into the plasma 125. Regardless of the particular power delivery embodiment implemented in the system 100 for generation of the plasma 125, it should be understood that during operation of the system 100, process gases supplied to the chamber 102 are transformed into the plasma 125, such that reactive constituents of the plasma 125 are exposed to the substrate 115 when disposed on the electrostatic chuck 101.

In one embodiment, the electrostatic chuck 101 is defined to control a temperature of the substrate 115 during performance of plasma processing operations on the substrate 115. In one embodiment, the electrostatic chuck 101 includes a number of cooling channels 113 through which a cooling fluid can be flowed during plasma processing operations to maintain temperature control of the substrate 115, i.e., to provide a heat sink to facilitate temperature control of the substrate 115. Also, in one embodiment, the electrostatic chuck 101 can include a number of heating elements 111 for increasing the temperature of the substrate 115.

Figure 1B:
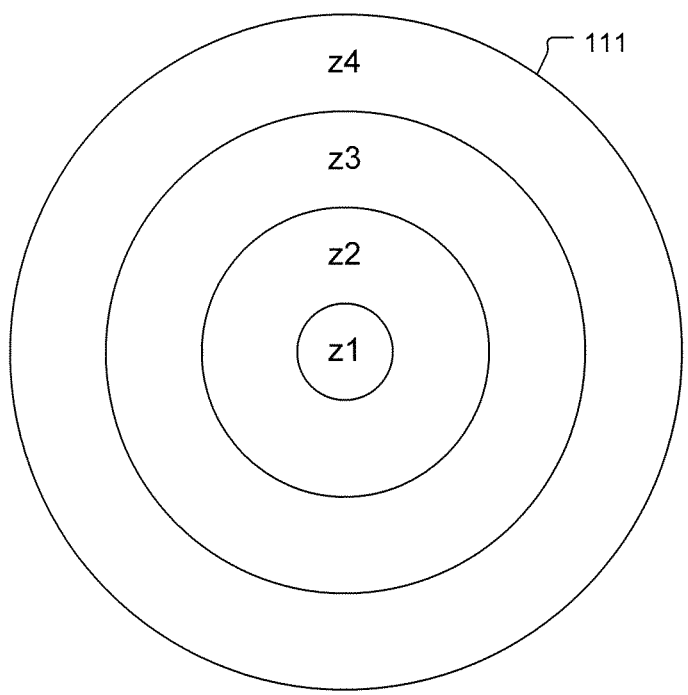
FIG. 1B shows a top view of the number of heaters illustrating the various heater zones (z1, z2, z3, z4) formed in a concentric radial manner, in accordance with one embodiment of the present invention.

In the example embodiment of FIG. 1A, the electrostatic chuck 101 includes the baseplate 103, a number of heaters 111 (z1, z2, z3, z4) disposed on the baseplate 103, a thermally conductive plate 109 disposed on the heaters 111, and a substrate support member 105 disposed on the thermally conductive plate 109. FIG. 1B shows a top view of the number of heaters 111 illustrating the various heater zones (z1, z2, z3, z4) formed in a concentric radial manner. Each of the heater zones (z1, z2, z3, z4) has a respective RF filter and AC power supply. Specifically, heater zone z1 receives electrical power from AC power supply 133, through RF filter 131, and through wire 132. Heater zone z2 receives electrical power from AC power supply 137, through RF filter 135, and through wire 136. Heater zone z3 receives electrical power from AC power supply 141, through RF filter 139, and through wire 138. Heater zone z4 receives electrical power from AC power supply 145, through RF filter 143, and through wire 144.

Also, in one embodiment, an electrical heating element 119 can be provided for the edge ring 117. The electrical heating element 119 receives electrical power from AC power supply 149, through RF filter 147, and through wire 148. Also, as previously mentioned, the baseplate 103 can include the number of cooling channels 113 through which a cooling fluid (liquid and/or gas) may be flowed to provide a heat sink.

In one embodiment, the baseplate 103 is formed of an electrically conductive material, such as a metal. In one embodiment, the baseplate 103 is formed of aluminum or an aluminum alloy. In another embodiment, the baseplate 103 is formed of stainless steel. In one embodiment, the substrate support member 105 is formed of a ceramic material. In various embodiments, the substrate support member 105 is formed of silicon carbide or aluminum oxide. In one embodiment, the substrate support member 105 can include a number of clamping electrodes 107, which can be electrically powered to provide an electrostatic clamping force to the substrate 115 when present on the substrate support member 105. For discussion purposes, the substrate support member 105 is also referred to as a layer of dielectric material 105. It should also be understood that in various embodiments, the electrostatic chuck 101 can be formed from different materials, such as stainless steel, aluminum, or ceramic, by way of example, so long as the electrostatic chuck 101 material is structurally capable of withstanding pressure differentials and temperatures to which it will be exposed during plasma processing, and is chemically compatible with the plasma processing environment.

To avoid unnecessarily obscuring the present invention, many features of the electrostatic chuck 101 are not described in detail herein. For example, details of the electrostatic chuck 101 are omitted for clarity with regard to the heating and cooling systems, the backside gas delivery system, the substrate handling system, e.g., substrate lifting pins, and edge contours, among other items.

Current thermal control for electrostatic chucks, edge rings and top plates use electric heaters. All these components are exposed to high RF voltages. The wires in the electric heaters and leading to the electric heaters perturb the RF fields and create non-uniform RF power delivery. Attempts are made to reduce this by using bulky RF filters on the wires going to and from the electric heaters, such as RF filters 131, 135, 139, 143, 147 shown in FIG. 1A, and by careful control of where the heater and wires are placed within the process chamber. In addition to causing non-uniformities, the presence of the metal heaters and wires in the high RF voltage environment is a risk for arcing, light-up, and plasma unconfinement, particularly as the RF power is increased.

One problem with electrical heaters in RF chucks, is that when RF power is applied to the chuck, the RF feeds back through the electric heater lines. The wires for the electric heaters are conductive and capacitively couple to the RF. This RF feedback is not desirable, because the RF power should be going to the plasma and not the heater lines. RF power feedback through the heater lines can also cause non-uniformities in the RF power applied to the plasma, which corresponds to plasma non-uniformities and leads to plasma process non-uniformities on the substrate. Also, the heaters require very large RF filters to prevent the RF power from reaching and damaging the heater power supplies. The heater RF filters at high frequency RF, e.g., 60 MHz, are large capacitor and inductor banks, such as about 12 inches long and 4 inches in diameter is some cases. The heater RF filters are disposed right outside the processing chamber. Therefore, the large heater RF filters can pose challenges with space management in a fabrication facility where optimization of space utilization is essential. An additional problem occurs during pulsed plasma operation, in that the heater plate, i.e., the thermally conductive plate 109, within the chuck itself blocks some of the RF bias signal, thereby leading to RF bias compensation difficulty.

In the present invention, optical fibers are used to deliver high intensity light from a laser or radiant heater to parts exposed to high RF and DC voltages. The non-conductive optical fibers do not perturb electrical field uniformity, arc, or need bulky RF filters. Zone tuning, chamber matching, and local heating control is accomplished by varying the light input into each optical fiber if desired. Instead of using electric heaters for the chuck (and edge ring in some cases) and incurring the adverse impact of their wired connections on the RF power transmission, the present invention uses optical fibers to direct light energy (photons) at the chuck, whereby the photons emitted by the optical fibers cause heating of the chuck. This is referred to as "radiative heating." Instead of using electric heaters in the baseplate or ceramic, a set of optical fibers are routed to the bottom of the dielectric plate (substrate support 105) to project photons onto the bottom of the dielectric plate and thereby cause heating of the dielectric plate.

An optical fiber is a flexible, transparent fiber, often made of glass or plastic. The optical fiber functions as a waveguide to transmit light between the ends of the optical fiber. Optical fibers can be defined to have a transparent core surrounded by a transparent cladding material with a lower index of refraction than the core. Light, i.e., photons, are kept in the core by total internal reflection. This causes the optical fiber to act as a waveguide.

The wavelength of the light projected on the layer of dielectric material 105 can be tuned such that the light is substantially absorbed by the layer of dielectric material 105. In one embodiment, a coating can be applied to the layer of dielectric material 105, where the coating material is defined to absorb the light projected from the optical fiber(s). In one embodiment, light can be supplied to the bundle of optical fibers using a lamp (such as a tungsten lamp) and appropriate focusing optics. This is a broadband wavelength application. In another embodiment, a laser and appropriate focusing optics can be used to supply light to the bundle of optical fibers. In another embodiment, LEDs and appropriate focusing optics/tuning optics can be used to supply light to the bundle of optical fibers. In another embodiment, an array of light sources, e.g., an array of lasers can be used to supply the required photon power to the bundle of optical fibers.

The same amount of heating power that needs to be applied to the layer of dielectric material 105 can be supplied in the form of light to the bundle of optical fibers. Therefore, the light source will be capable of supplying that power level in the form of photons. In one embodiment, an amount of light supplied to individual optical fibers can be controlled. In one embodiment, the optical fibers can be grouped into multiple bundles of optical fibers, with an amount of light supplied to each bundle individually controlled. In this embodiment, the optical fibers of a given bundle may be directed to a particular region of the layer of dielectric material 105. By controlling the light supplied to different spatially dispersed optical fibers, or bundles thereof, or groups of optical fibers, it is possible to spatially control radiant heating of the layer of dielectric material 105.

Optical fibers can also be used to heat the edge ring, and if necessary provide spatial control of heating of the edge ring. In one embodiment, the different optical fibers can be routed to the bottom of the layer of dielectric material 105 through holes in the chuck and glued in place. This is similar to how the electrical wires are routed for the existing electrical heaters. So, in this embodiment, the electrical wires would be removed and the optical fibers would be routed instead of the electrical wires. In some embodiments, optical fibers are connected to the bottom of the layer of dielectric material 105 for the purpose of measuring temperature. In one embodiment, these temperature measurement optical fibers can be used to transmit photons to the layer of dielectric material 105 for the purpose of heating. The optical fibers are not required to physically contact the layer of dielectric material 105 so long as the photons emitted from the end of the optical fibers is projected onto the bottom of the layer of dielectric material 105.

In one embodiment, a planar waveguide can be connected to the bottom of the layer of dielectric material 105, with a prism connected to the planar waveguide, and an optical fiber or bundle of optical fibers aimed at the prism. In this embodiment, photons projected from the bundle of optical fibers into the prism will be transmitted uniformly throughout the waveguide and scattered so as to be incident on the layer of dielectric material 105 and cause heating of the layer of dielectric material 105. It should be appreciated that this embodiment can simplify the routing of optical fibers through the chuck by reducing the number of optical fibers required and by reducing the number of locations where the optical fibers will need to be routed. In this embodiment, the planar waveguide can be designed to have an arrangement of defects (or scattering points) that cause the photons to be scattered toward the bottom of the layer of dielectric material 105 as the photons travel through the waveguide from the prism.

To provide tunability in the planar waveguide embodiment, multiple waveguide layers can be used, each having their own prism and optical fiber bundle, such that different waveguide layers or combinations of waveguide layers can be activated to provide different light projections onto the layer of dielectric material 105. In this case, the different waveguide layers may have different spatial arrangements of scattering points, such that different waveguide layers focus light on different portions of the layer of dielectric material 105.

The optical fibers that carry photons to the layer of dielectric material 105 for heating purposes can also be used to measure temperature if a phosphor is applied to the layer of dielectric material 105 at the output of the optical fiber. During a non-heating time, a pulse of light can be transmitted through the optical fiber to excite the phosphor, then the light emitted by the phosphor and its associated decay can be observed through the optical fiber to determine the temperature of the phosphor and hence the temperature of the layer of dielectric material 105 at that location.

Figure 2A:
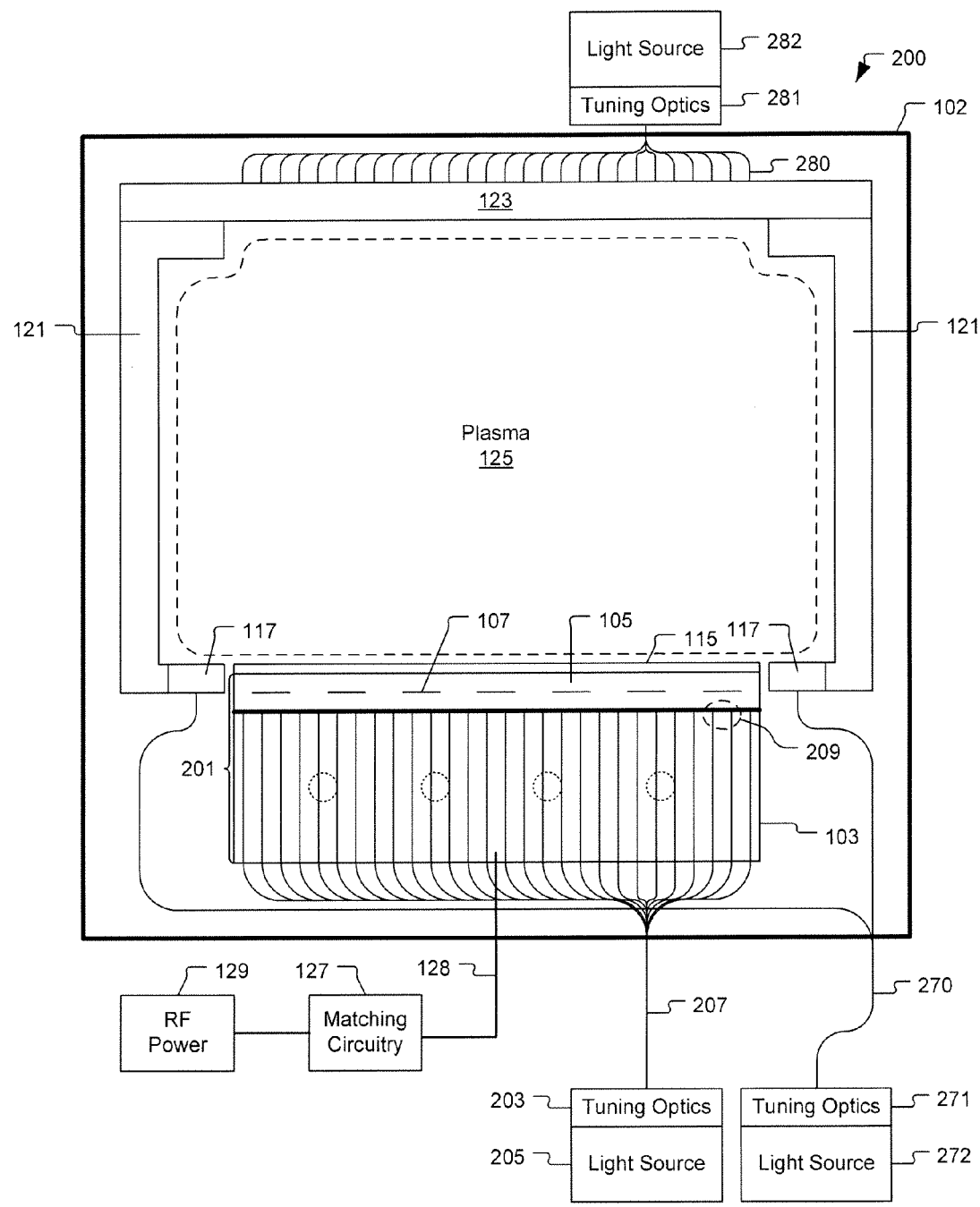
FIG. 2A shows a vertical cross-section of a plasma-driven substrate processing system, in accordance with one embodiment of the present invention.

FIG. 2A shows a vertical cross-section of a plasma-driven substrate processing system 200, in accordance with one embodiment of the present invention. The system 200 includes the chamber 102 as described with regard to FIG. 1A. However, the system 200 implements a substrate support 201 in which there is no thermally conductive plate 109, no electric heaters 111, and no wires associated with electric heaters. The substrate support 201 includes the layer of dielectric material 105 having a top surface and a bottom surface. The top surface of the layer of dielectric material 105 is defined to support the substrate 115 in exposure to a plasma generation region, where the plasma 125 is generated. The substrate support 201 includes the baseplate 103 of thermally conductive material. The layer of dielectric material 105 is affixed to a top surface of the baseplate 103. In one embodiment, the layer of dielectric material 105 is affixed to the top surface of the baseplate 103 using a thermally conductive adhesive. The baseplate 103 includes a number of passages having respective exit locations at the top surface of the baseplate 103.

A number of optical fibers 107 are respectively routed through the number of passages within the baseplate 103. Each of the number of optical fibers 107 has a first end and a second end. The first end of each optical fiber 107 is defined to receive photons from a photon source 205 (i.e., light source 205), by way of tuning optics 203. The second end of each optical fiber 207 is oriented to project photons onto the bottom surface of the layer of dielectric material 105. The tuning optics 203 are disposed between the photon source 205 and the first end of each of the number of optical fibers 207. The tuning optics 203 are defined to optimize transmission of photons from the photon source 205 into the number of optical fibers 207.

The baseplate 103 remains electrically connected to receive the RF power from the RF power supply 129, by way of the matching circuitry 127, as indicated by the connection 128. However, it should be understood that the number of optical fibers 207 routed through the number of passages within the baseplate 103 are transparent to the RF power, and therefore do not interfere with transmission of the RF power through the substrate support 201. Also, the clamping electrodes 107 are disposed within the layer of dielectric material 105 and are defined to provide the electrostatic clamping force to the substrate 115 when electric power is supplied to the number of electrodes with the substrate 115 present on the top surface of the layer of dielectric material 105.

The system 200 also includes the edge ring 117 defined to circumscribe the top surface of the layer of dielectric material 105. A second number of optical fibers 270 are respectively routed to the edge ring 117. And, the electric heater 119 for the edge ring, along with its associated wires, as shown in FIG. 1A, are not present to cause interference with RF power transmission through the chamber 102. Each of the second number of optical fibers 270 has a first end and a second end, with the first end defined to receive photons from a photon source 272, by way of tuning optics 271, and with the second end oriented to project photons onto the edge ring 117. More specifically, the photon source 272 is connected to transmit photons into the first end of each of the second number of optical fibers 270.

The system 200 also includes a third number of optical fibers 280 respectively routed to the top electrode 123. Each of the third number of optical fibers 280 has a first end and a second end, with the first end defined to receive photons from a photon source 282, by way of tuning optics 281, and with the second end oriented to project photons onto the top electrode 123. More specifically, the photon source 282 is connected to transmit photons into the first end of each of the third number of optical fibers 280.

Figure 2B:
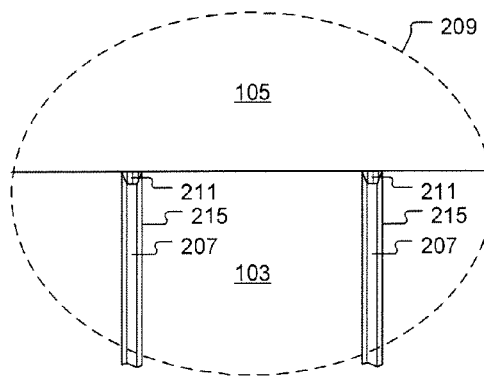
FIGS. 2B through 2E show different examples of the interface between the baseplate and the layer of dielectric material, in accordance with various embodiments of the present invention.

In one embodiment, the second end of each of the number of optical fibers 207 is spaced apart from and pointed toward the bottom surface of the layer of dielectric material 105. It should also be understood that the photons emanating from the second ends of the optical fibers 207 are incident upon and absorbed by the layer of dielectric material 105, causing the layer of dielectric material 105 to be heated. FIGS. 2B through 2E show different examples of the interface 209 between the baseplate 103 and the layer of dielectric material 105, in accordance with various embodiments of the present invention. FIG. 2B shows the optical fiber 207 extending through a passage 215 within the baseplate 103. The second end of the optical fiber 207 is spaced apart from and pointed toward the bottom surface of the layer of dielectric material 105, such that photons 211 emanating from the second end of the optical fiber 207 are incident upon the bottom surface of the layer of dielectric material 105.

Figure 2C:
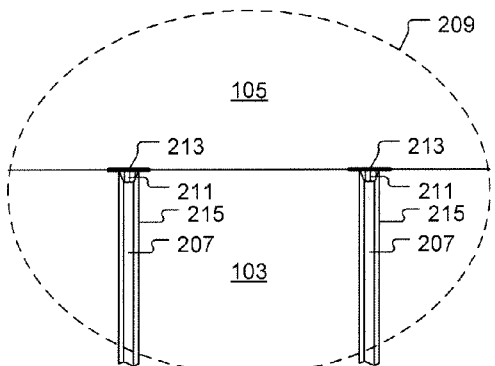

FIG. 2C shows a variation of FIG. 2B in which a phosphor-containing material 213 is disposed on the bottom surface of the layer of dielectric material 105, at each location toward which the second end of any of the number of optical fibers 207 is pointed. During a non-heating period, the phosphor-containing material 213 is defined to exhibit a temperature-dependent fluorescence lifetime upon absorption of photon energy that can be monitored through the optical fiber 207 to determine a temperature of the layer of dielectric material 105 at the location of the phosphor-containing material 213.

Figure 2D:
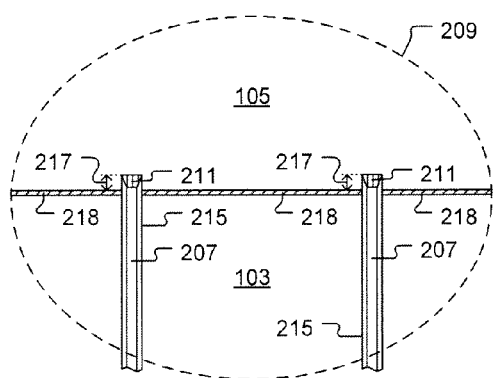
Figure 2E:
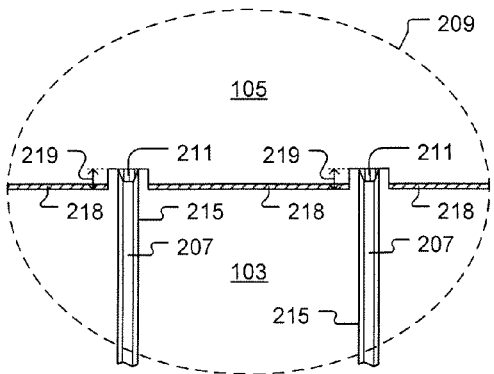

FIG. 2D shows a variation of FIG. 2B in which the layer of dielectric material 105 includes a number of recessed regions, as denoted by arrow 217, formed to extend from the bottom surface of the layer of dielectric material 105 into the layer of dielectric material 105, at locations respectively corresponding to exit locations of the number of passages 215 at the top surface of the baseplate 103. Each of the number of optical fibers 207 is positioned to extend above the top surface of the baseplate 103 and into a respective one of the number of recessed regions 217 within the layer of dielectric material 105. In this manner the layer of dielectric material 105 can be adhered to the baseplate 103 without the ends of the optical fibers 207 potentially becoming obscured by adhesive 218. FIG. 2E shows a variation of FIG. 2D in which the baseplate 103 is defined to extend upward into each of the recessed regions 217 formed on the bottom of the layer of dielectric material 105, as denoted by the arrow 219, so as to further protect the ends of the optical fibers from becoming obscured.

Figure 2F:
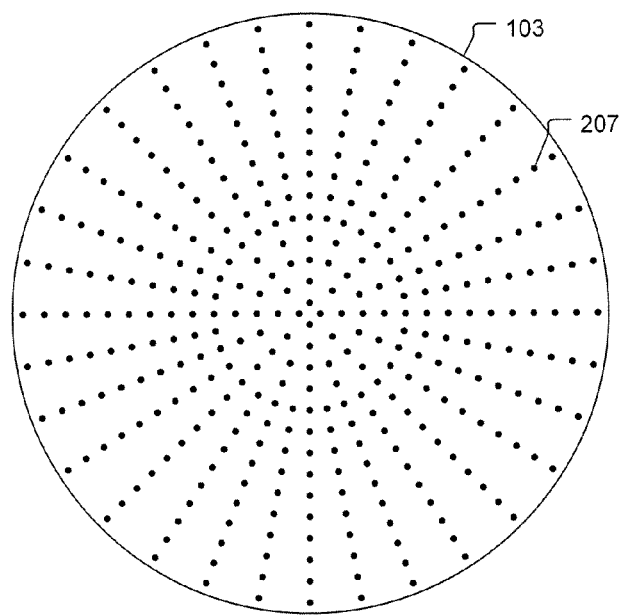
FIG. 2F shows a top view of the baseplate with the optical fibers at their respective exit locations, so as to provide a substantially uniform distribution of photons onto the bottom surface of the layer of dielectric material, in accordance with one embodiment of the present invention.

In one embodiment, the number of optical fibers 207 are positioned/routed to provide a substantially uniform distribution of locations across the bottom surface of the layer of dielectric material 105, at which the second ends of the number of optical fibers 207 are pointed. For example, FIG. 2F shows a top view of the baseplate 103 with the optical fibers 207 at their respective exit locations, so as to provide a substantially uniform distribution of photons onto the bottom surface of the layer of dielectric material 105.

In various embodiment, the number of optical fibers 207 can be split into multiple groups, i.e., bundles, of optical fibers, such that each optical fiber within a given group of optical fibers is routed to have its second end project photons onto a particular region of the bottom surface of the layer of dielectric material 105. Also, in various embodiment such as these, the photon source 205 is defined as a number of independently controllable photon sources each connected to transmit photons into the first ends of the optical fibers within a given one of the multiple groups of optical fibers.

Figure 2G:
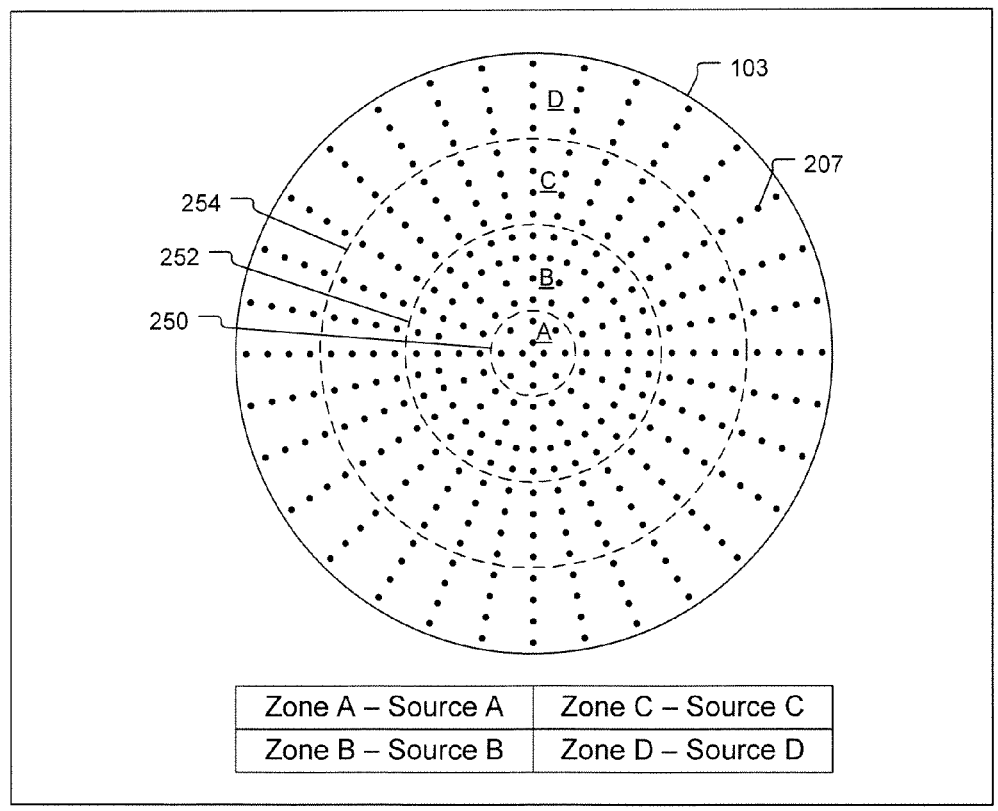
FIG. 2G shows the number of optical fibers segregated into multiple zones A, B, C, D, with each of the multiple zones A, B, C, D covering, i.e., projecting onto, a different area of the bottom surface of the layer of dielectric material, in accordance with one embodiment of the present invention.
Figure 2H:
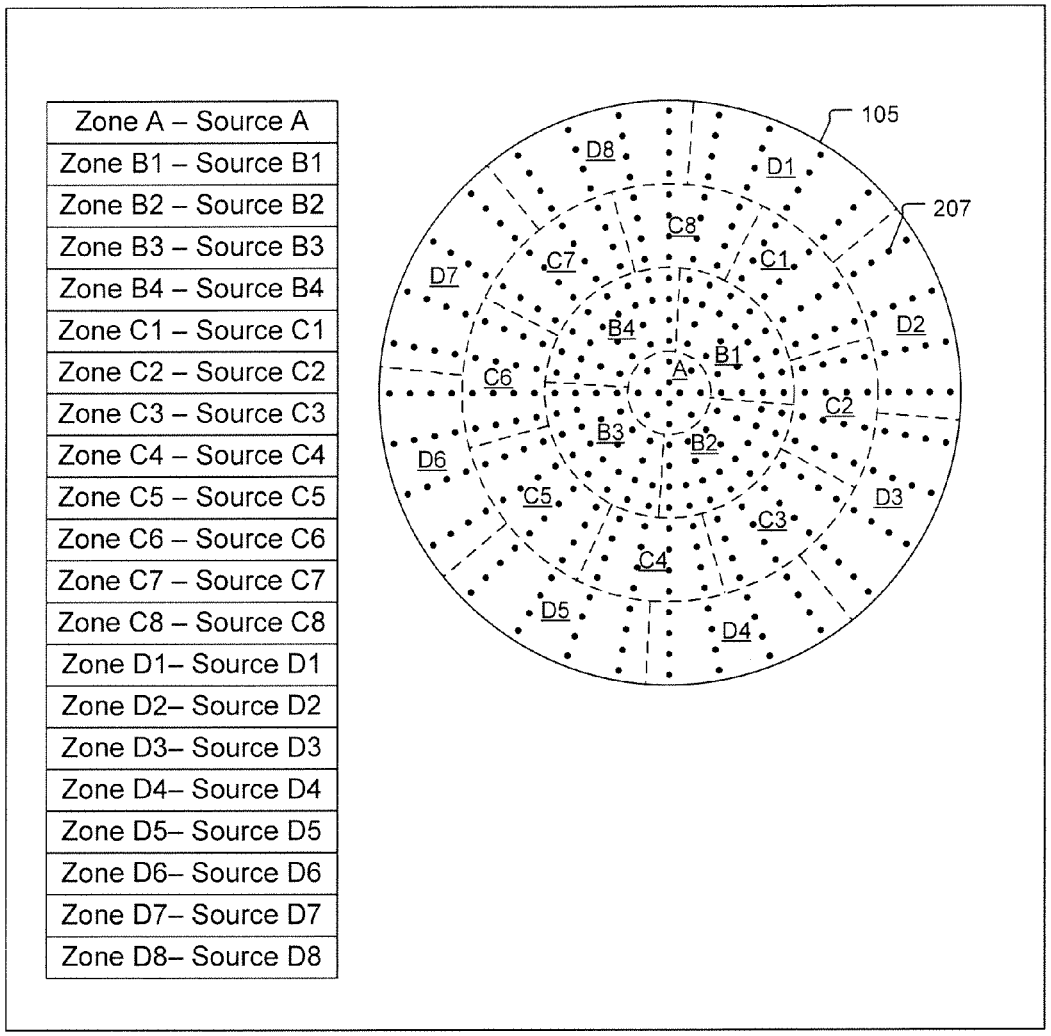
FIG. 2H shows the optical fibers segregated into multiple zones both radially and azimuthally, in accordance with one embodiment of the present invention.

For example, FIG. 2G shows the number of optical fibers 207 segregated into multiple zones A, B, C, D, with each of the multiple zones A, B, C, D covering, i.e., projecting onto, a different area of the bottom surface of the layer of dielectric material 105. The zones A, B, C, D are delineated by dashed lines 250, 252, and 254. Optical fibers 207 corresponding to a given one of the multiple zones A, B, C, D are grouped together/bundled to have their first ends connected to receive photons from one of multiple photon sources (Sources A, B, C, D) respectively corresponding to the multiple zones A, B, C, D. The zoning of the optical fibers 207 can be performed in many different ways. For example, FIG. 2H shows the optical fibers 207 segregated into multiple zones both radially and azimuthally.

Figure 3A:
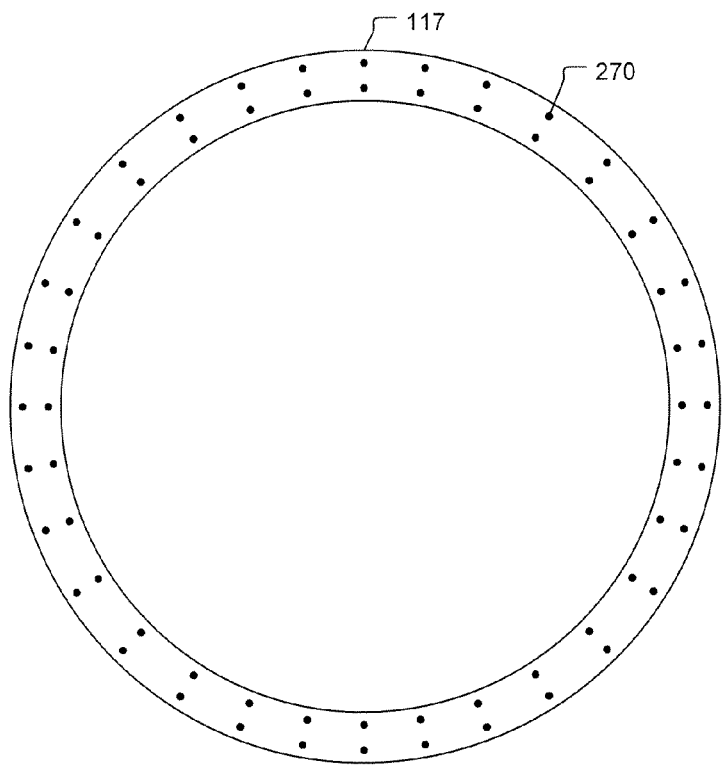
FIG. 3A shows a bottom view of the edge ring with the black dots corresponding to locations of the optical fibers, in accordance with one embodiment of the present invention.
Figure 3B:
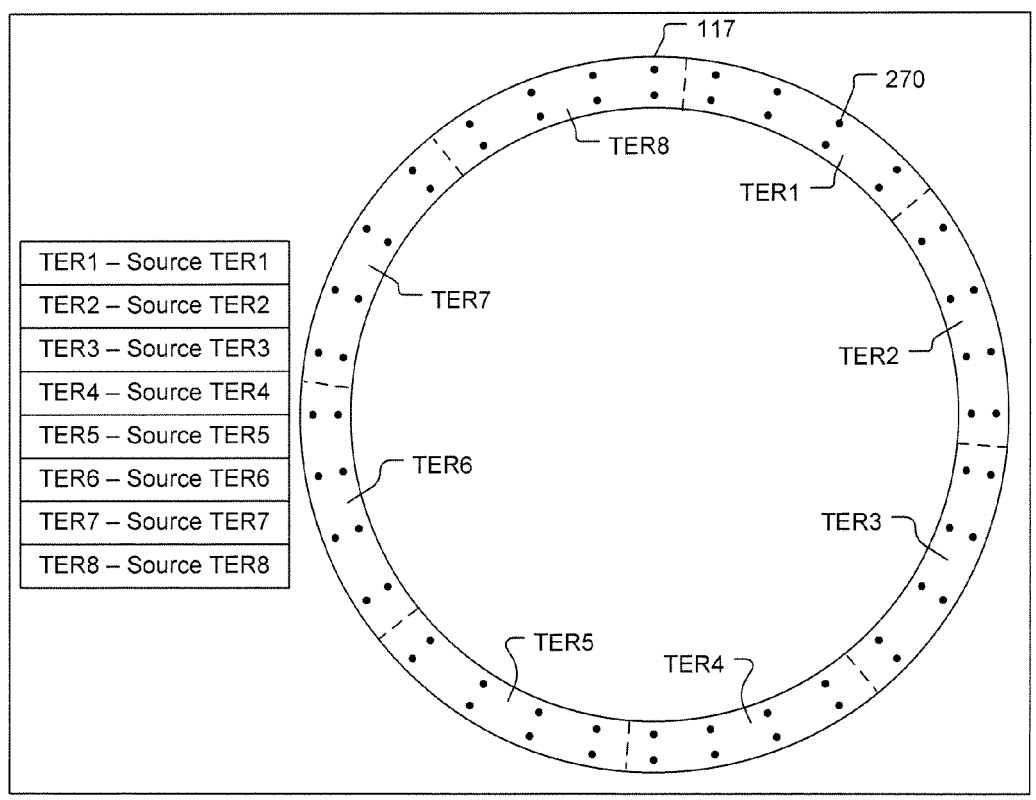
FIG. 3B shows the optical fibers of the edge ring azimuthally segmented into multiple zones, with optical fibers of a given zone receiving photons from an independently controlled photon source to provide for azimuthal temperature control of the edge ring, in accordance with one embodiment of the present invention.

FIG. 3A shows a bottom view of the edge ring 117 with the black dots corresponding to locations of the optical fibers 270. As with the baseplate 103 optical fibers 207, the optical fibers 270 of the edge ring 117 can be uniformly distributed to provide for uniform heating of the edge ring. Also, as shown in FIG. 3B, the optical fibers 270 of the edge ring 117 can be azimuthally segmented into multiple zones (TER1-TER8), with optical fibers 270 of a given zone receiving photons from an independently controlled photon source to provide for azimuthal temperature control of the edge ring 117.

Figure 4A:
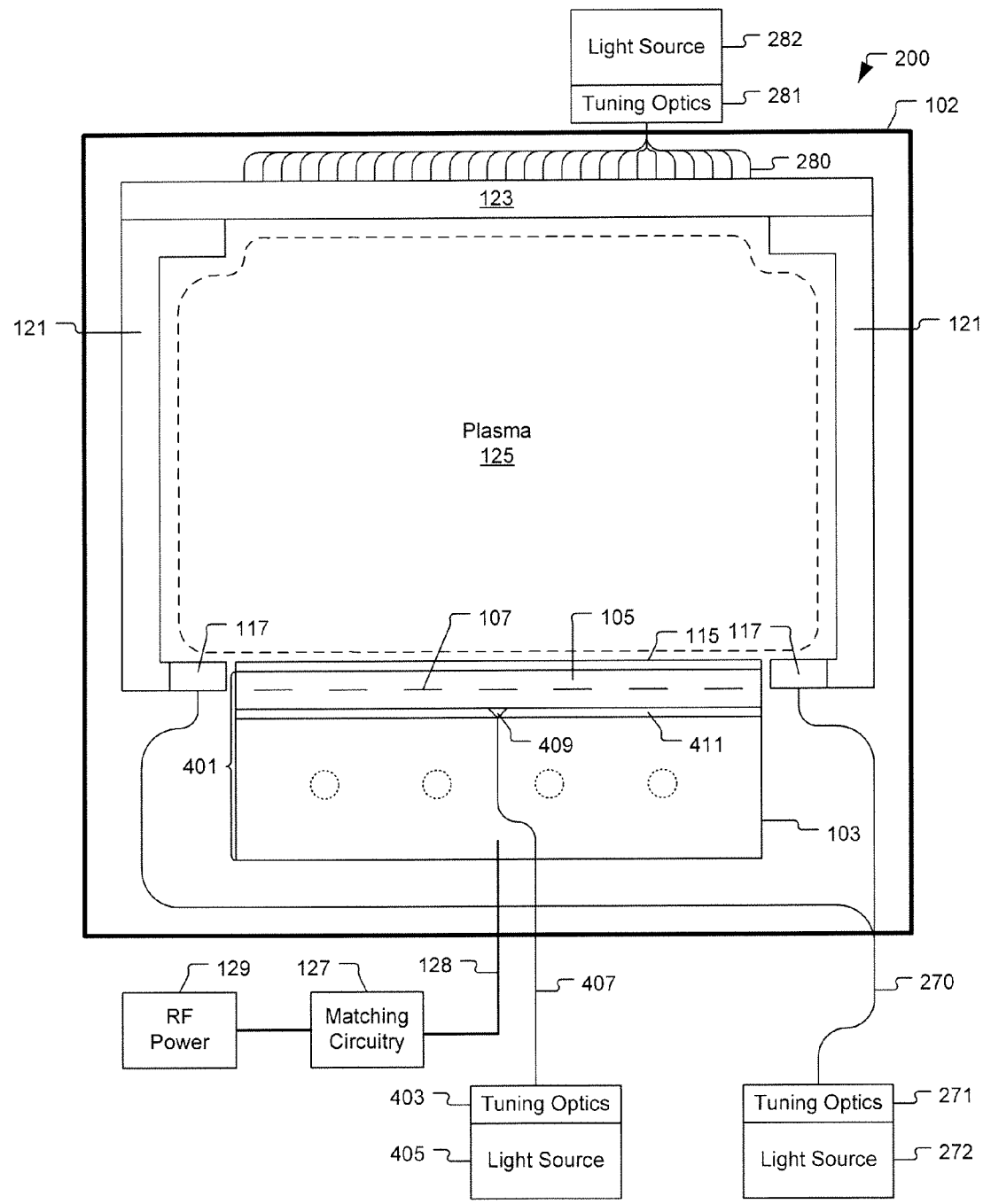
FIG. 4A shows a variation of the system in which the individually routed optical fibers are replaced with a singular bundle of fibers routed to a prism of a planar waveguide, in accordance with one embodiment of the present invention.

FIG. 4A shows a variation of the system 200 in which the individually routed optical fibers 207 are replaced with a singular bundle of fibers 407 routed to a prism 409 of a planar waveguide 411. The planar waveguide 411 is positioned on the bottom surface of the layer of dielectric material 105. The second end of each of the number of optical fibers 407 is oriented to project photons received from the photon source 405, by way of the tuning optics 403, into the prism 409, so as to direct the photons through the prism 409 into the planar waveguide 411 and onto the bottom surface of the layer of dielectric material 105. The planar waveguide 411 can include a number of scattering objects defined to scatter photons onto the bottom surface of the layer of dielectric material 105 as they photons travel from the prism 409 radially outward through the waveguide 411.

Figure 4B:
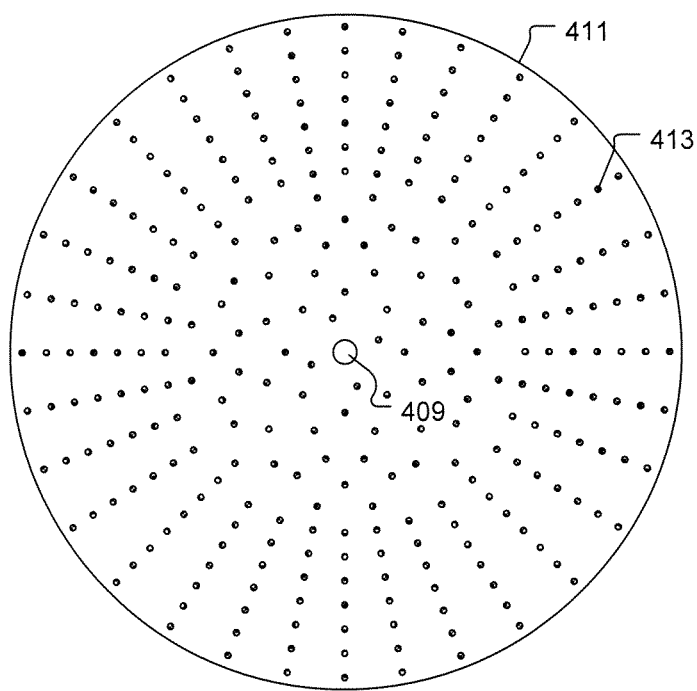
FIG. 4B shows a cross-section view of the waveguide in which a number of scattering objects are distributed to provide a substantially uniform scattering of photons onto the bottom surface of the layer of dielectric material, in accordance with one embodiment of the present invention.
Figure 4C:
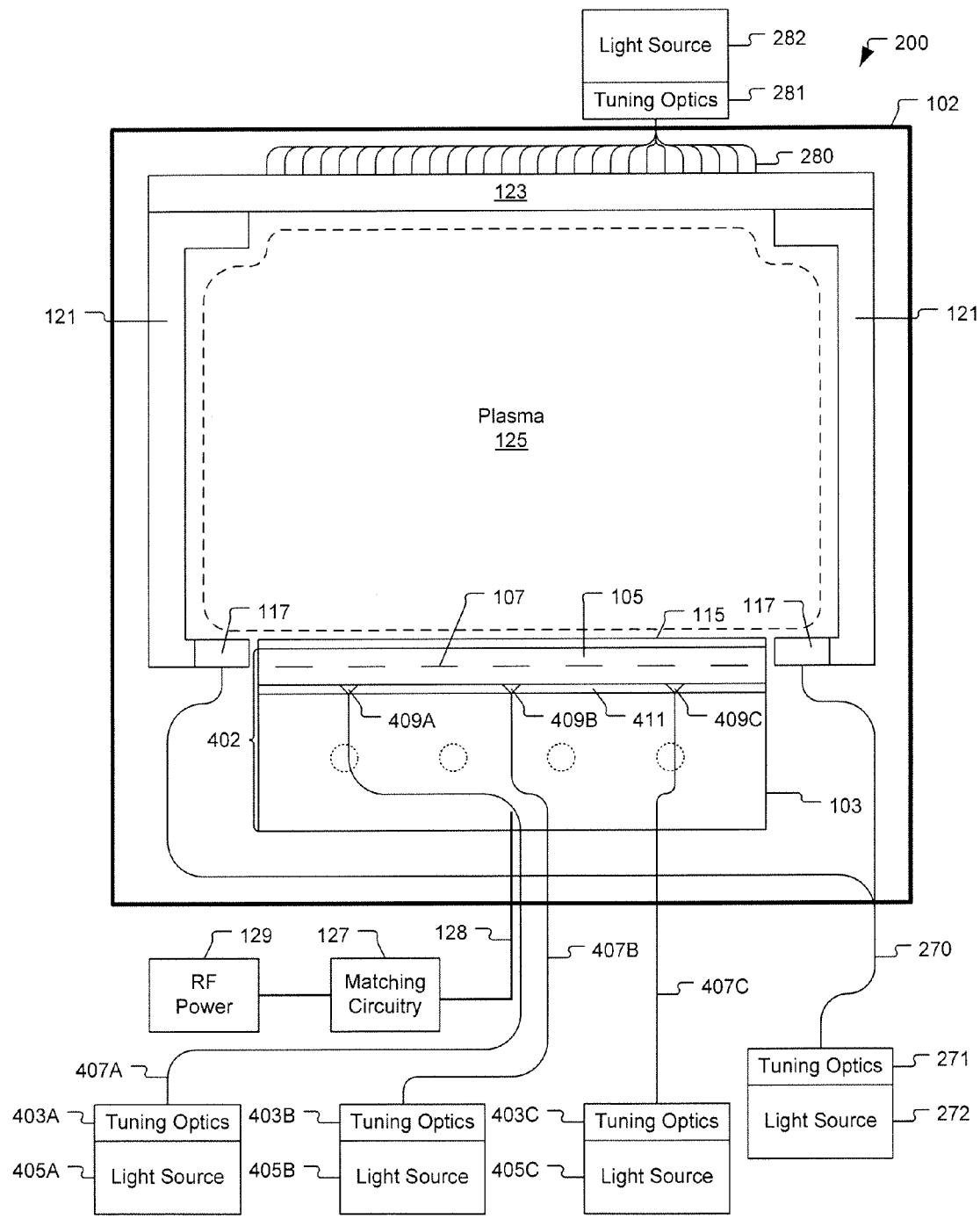
FIG. 4C shows a variation of the system of FIG. 4A in which multiple prisms are used to receive and project photons into the waveguide, in accordance with one embodiment of the present invention.
Figure 4D:
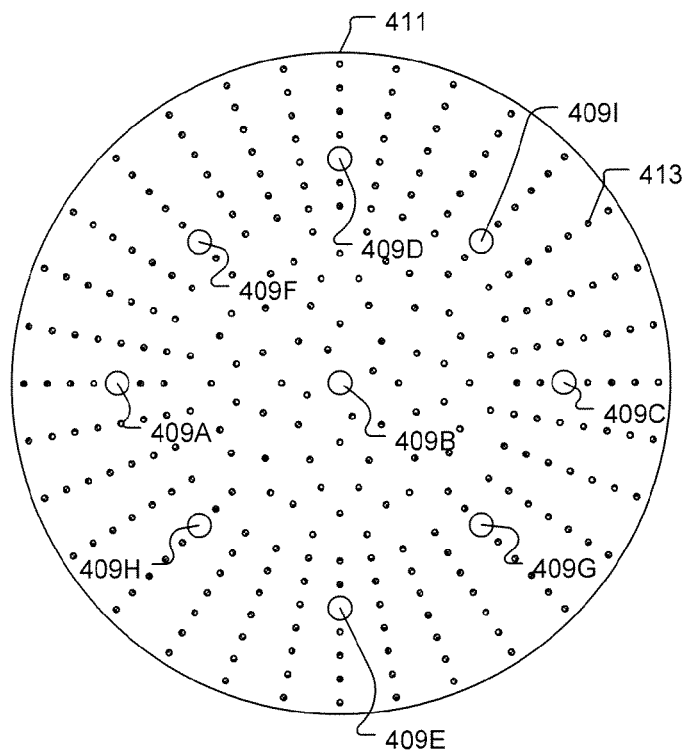
FIG. 4D shows a cross-section view of the planar waveguide indicating an example distribution of the prisms across the waveguide, in accordance with one embodiment of the present invention.
Figure 4E:
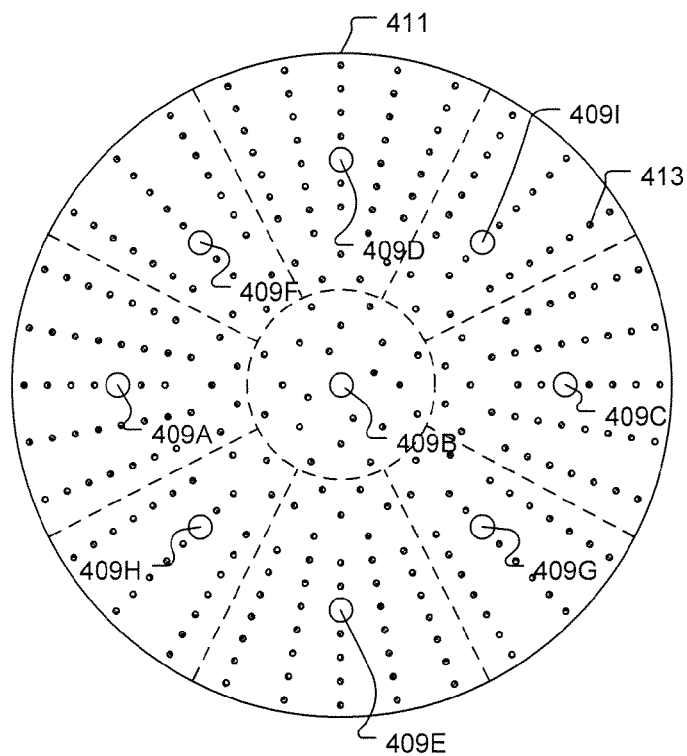
FIG. 4E shows a segmentation of the planar waveguide in both radial and azimuthal directions, as indicated by the dashed lines.

FIG. 4B shows a cross-section view of the waveguide 411 in which a number of scattering objects 413 are distributed to provide a substantially uniform scattering of photons onto the bottom surface of the layer of dielectric material 105. FIG. 4C shows a variation of the system of FIG. 4A in which multiple prisms, e.g., 409A, 409B, 409C, are used to receive and project photons into the waveguide 411. Each prism is defined to received photons from a respective bundle of optical fibers 407A, 407B, 407C, which receive the photons from respective photon sources 405A, 405B, 405C, by way of respective tuning optics 403A, 403B, 403C. FIG. 4D shows a cross-section view of the planar waveguide 411 indicating an example distribution of the prisms 409A-409I across the waveguide 411. FIG. 4E shows a segmentation of the planar waveguide 411 in both radial and azimuthal directions, as indicated by the dashed lines. In the example of FIG. 4E, each segmented region of the planar waveguide can be a physically separate structure, such that the planar waveguide is assembled in a puzzle-like manner, and such that photons may not readily travel between different segments of the planar waveguide.

Figure 5:
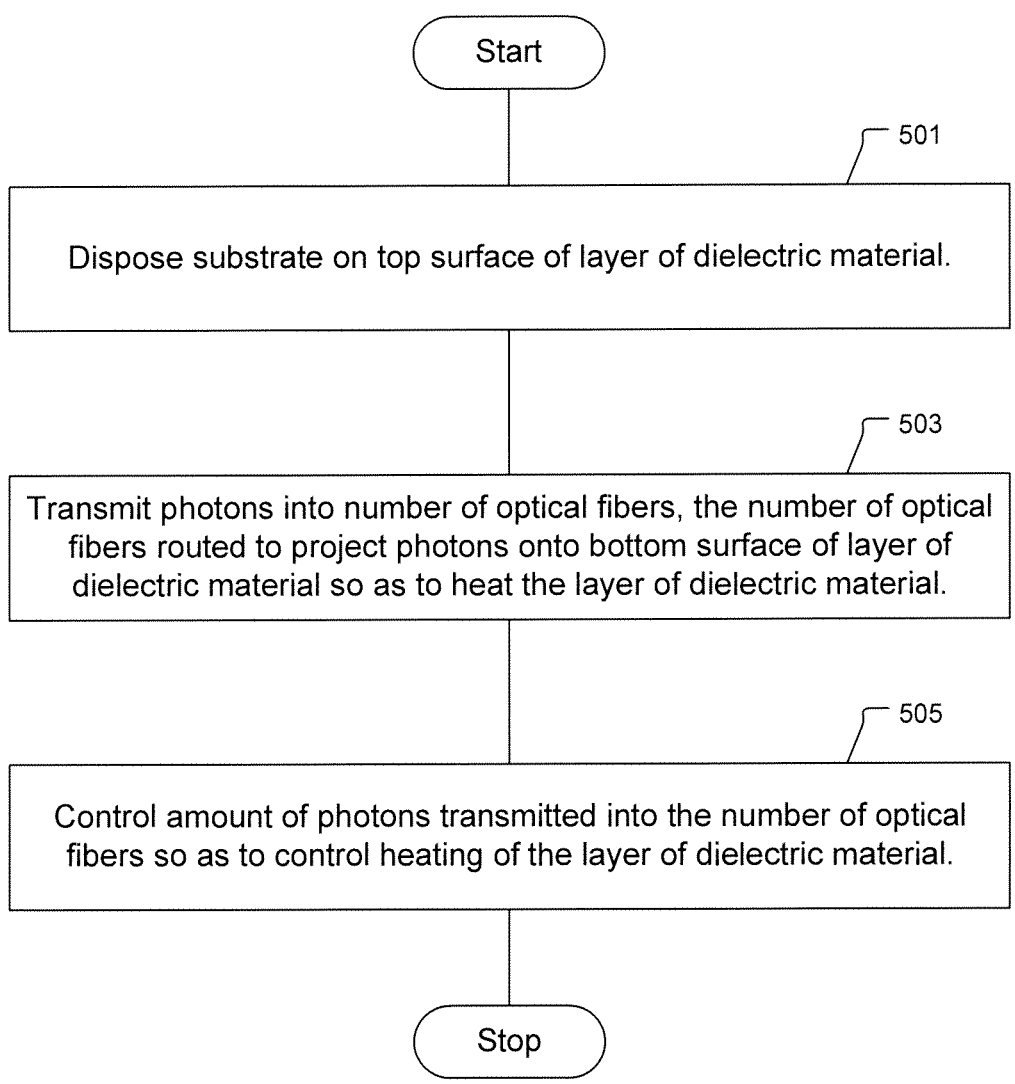
FIG. 5 shows a method for operating a plasma processing system, in accordance with one embodiment of the present invention.

FIG. 5 shows a method for operating a plasma processing system, in accordance with one embodiment of the present invention. The method includes an operation 501 for disposing a substrate on a top surface of a layer of dielectric material. The method includes an operation 503 for transmitting photons into a number of optical fibers. The number of optical fibers are routed to project photons onto a bottom surface of the layer of dielectric material so as to heat the layer of dielectric material. The method also includes an operation 505 for controlling an amount of photons transmitted into the number of optical fibers so as to control a heating of the layer of dielectric material.

It should be appreciated that the optical fiber based heating, i.e., radiative heating, described herein can be utilized in essentially any plasma processing chamber and/or other semiconductor fabrication chamber, and with any other substrate support 105 or substrate support 105 material, where the substrate support 105 needs to be heated in a controlled manner. Some advantages of the optical fiber based heating of the present invention include, but are not limited to, the following:

No additional metal in RF hot environment, thereby reduced arcing risk at high RF power.
No RF filters needed.
Heater can be far removed from surface to be heated.
Can use light intensity or duty cycle to adjust delivered heating power.
Relatively easy to create zones or azimuthal temperature tunability or even an arbitrary heat delivery profile.
Can provide for azimuthal non-uniformity tuning remote from chuck and out of the RF environment.
Can use optical fibers as optical probes (for temperature measurements, for example) in addition to delivering heat.
Optical fiber connections can be made in vacuum.
Potentially simpler/cheaper chuck construction and design due to lack of conductive heater components and associated wires.
Thinner ceramic and no heater plate means better thermal transfer (high RF power) and better voltage matching (Vpp).

While this invention has been described in terms of several embodiments, it will be appreciated that those skilled in the art upon reading the preceding specification and studying the drawings will realize various alterations, additions, permutations and equivalents thereof. The present invention includes all such alterations, additions, permutations, and equivalents as fall within the true spirit and scope of the invention.

What is claimed is:

1. A substrate support apparatus for a plasma processing system, comprising:
a layer of dielectric material having a top surface and a bottom surface, the top surface defined to support a substrate in exposure to a plasma;
a number of optical fibers each having a first end and a second end, the first end defined to receive photons from a photon source, the second end oriented to project photons received from the photon source onto the bottom surface of the layer of dielectric material, wherein each of the number of optical fibers extends from the layer of dielectric material to the photon source located outside of a chamber in which the layer of dielectric material is located, such that the first end of each of the number of optical fibers is located outside of the chamber, wherein the second end of each of the number of optical fibers is spaced apart from and pointed toward the bottom surface of the layer of dielectric material; and
a baseplate of thermally conductive material, the layer of dielectric material affixed to a top surface of the baseplate, the baseplate including a number of passages through which the number of optical fibers are respectively routed.

2. The substrate support apparatus as recited in claim 1, further comprising:
a number of electrodes disposed within the layer of dielectric material and defined to provide an electrostatic clamping force to the substrate when electric power is supplied to the number of electrodes with the substrate present on the top surface of the layer of dielectric material.

3. The substrate support apparatus as recited in claim 1, wherein the number of optical fibers are positioned to provide a substantially uniform distribution of locations across the bottom surface of the layer of dielectric material at which the second ends of the number of optical fibers are pointed.

4. The substrate support apparatus as recited in claim 1, further comprising:
a phosphor-containing material disposed on the bottom surface of the layer of dielectric material at each location toward which the second end of any of the number of optical fibers is pointed, the phosphor-containing material defined to exhibit a temperature-dependent fluorescence lifetime upon absorption of photon energy.

5. The substrate support apparatus as recited in claim 1, wherein the layer of dielectric material includes a number of recessed regions formed to extend from the bottom surface of the layer of dielectric material into the layer of dielectric material at locations respectively corresponding to exit locations of the number of passages at the top surface of the baseplate.

6. The substrate support apparatus as recited in claim 5, wherein each of the number of optical fibers is positioned to extend above the top surface of the baseplate and into a respective one of the number of recessed regions within the layer of dielectric material.

7. The substrate support apparatus as recited in claim 1, wherein the baseplate is electrically conductive and defined to receive and conduct radiofrequency power.

8. The substrate support apparatus as recited in claim 1, wherein the number of optical fibers are segregated into multiple zones, each of the multiple zones covering a different area of the bottom surface of the layer of dielectric material, wherein optical fibers corresponding to a given one of the multiple zones have their first ends connected to receive photons from one of multiple photon sources respectively corresponding to the multiple zones.

9. A substrate support apparatus for a plasma processing system, comprising:
a layer of dielectric material having a top surface and a bottom surface, the top surface defined to support a substrate in exposure to a plasma;
a number of optical fibers each having a first end and a second end, the first end defined to receive photons from a photon source, the second end oriented to project photons received from the photon source onto the bottom surface of the layer of dielectric material, wherein each of the number of optical fibers extends from the layer of dielectric material to the photon source located outside of a chamber in which the layer of dielectric material is located, such that the first end of each of the number of optical fibers is located outside of the chamber;
a planar waveguide positioned on the bottom surface of the layer of dielectric material; and a prism connected to the waveguide, wherein the second end of each of the number of optical fibers is oriented to project photons received from the photon source into the prism, so as to direct the photons through the prism into the planar waveguide and onto the bottom surface of the layer of dielectric material.

10. The substrate support apparatus as recited in claim 9, wherein the planar waveguide includes a number of scattering objects defined to scatter photons onto the bottom surface of the layer of dielectric material.

11. The substrate support apparatus as recited in claim 10, wherein the number of scattering objects are distributed to provide a substantially uniform scattering of photons onto the bottom surface of the layer of dielectric material.

12. A plasma processing system, comprising:
a substrate support including a layer of dielectric material having a top surface and a bottom surface, the top surface defined to support a substrate in exposure to a plasma generation region, the substrate support including a baseplate of thermally conductive material, the layer of dielectric material affixed to a top surface of the baseplate, the baseplate including a number of passages having respective exit locations at the top surface of the baseplate;
a number of optical fibers respectively routed through the number of passages within the baseplate, each of the number of optical fibers having a first end and a second end, the first end defined to receive photons, the second end oriented to project photons onto the bottom surface of the layer of dielectric material; and
a photon source connected to transmit photons into the first end of each of the number of optical fibers.

13. The plasma processing system as recited in claim 12, further comprising:
tuning optics disposed between the photon source and the first end of each of the number of optical fibers, the tuning optics defined to optimize transmission of photons from the photon source into the number of optical fibers.

14. The plasma processing system as recited in claim 12, further comprising:
a radiofrequency power source connected to the baseplate of the substrate support, the radiofrequency power source defined to transmit radiofrequency power through the baseplate and through the layer of dielectric material into the plasma generation region, wherein the number of optical fibers routed through the number of passages within the baseplate are transparent to the radiofrequency power.

15. The plasma processing system as recited in claim 12, further comprising:
an edge ring defined to circumscribe the top surface of the layer of dielectric material;
a second number of optical fibers respectively routed to the edge ring, each of the second number of optical fibers having a first end and a second end, the first end defined to receive photons, the second end oriented to project photons onto the edge ring; and
a second photon source connected to transmit photons into the first end of each of the second number of optical fibers.

16. The plasma processing system as recited in claim 12, wherein the number of optical fibers are split into multiple groups of optical fibers, such that each optical fiber within a given group of optical fibers is routed to have its second end project photons onto a particular region of the bottom surface of the layer of dielectric material, and wherein the photon source is defined as a number of independently controllable photon sources each connected to transmit photons into the first ends of the optical fibers within a given one of the multiple groups of optical fibers.

17. A method for operating a plasma processing system, comprising:
providing a plasma processing system including—
a chamber,
a layer of dielectric material having a top surface and a bottom surface, the top surface defined to support a substrate in exposure to a plasma within the chamber,
a photon source located outside of the chamber,
a number of optical fibers each having a first end and a second end, the first end defined to receive photons from the photon source, the second end oriented to project photons received from the photon source onto the bottom surface of the layer of dielectric material, wherein each of the number of optical fibers extends from the layer of dielectric material to the photon source located outside of the chamber in which the layer of dielectric material is located, such that the first end of each of the number of optical fibers is located outside of the chamber, wherein the second end of each of the number of optical fibers is spaced apart from and pointed toward the bottom surface of the layer of dielectric material, and
a baseplate of thermally conductive material having a top surface upon which the layer of dielectric material is affixed, the baseplate including a number of passages through which the number of optical fibers are respectively routed;
disposing a substrate on the top surface of the layer of dielectric material;
transmitting photons from the photon source into the number of optical fibers, the number of optical fibers routed to project photons onto the bottom surface of the layer of dielectric material so as to heat the layer of dielectric material; and
controlling an amount of photons transmitted into the number of optical fibers so as to control a heating of the layer of dielectric material.

18. The method for operating a plasma processing system as recited in claim 17, further comprising:
transmitting radiofrequency power through the layer of dielectric material to generate the plasma in exposure to the substrate disposed on the top surface of the layer of dielectric material, whereby the transmitted radiofrequency power is not influenced by the number of optical fibers.

* * * * *